(12) United States Patent
Choi

(10) Patent No.: US 6,777,162 B2
(45) Date of Patent: Aug. 17, 2004

(54) PHOTOSENSITIVE POLYMER AND PHOTORESIST COMPOSITION THEREOF

(75) Inventor: Sang-jun Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 179 days.

(21) Appl. No.: 10/227,939

(22) Filed: Aug. 26, 2002

(65) Prior Publication Data

US 2003/0091928 A1 May 15, 2003

(30) Foreign Application Priority Data

Aug. 25, 2001 (KR) ......................................... 2001-51591

(51) Int. Cl.$^7$ .......................... G03F 7/038; C08F 8/18; C08F 220/12; C08F 220/18; C08F 16/24
(52) U.S. Cl. .................... 430/270.1; 430/907; 430/914; 526/247; 526/281; 526/329.6
(58) Field of Search ............................ 430/270.1, 907, 430/914; 526/247, 281, 329.6

(56) References Cited

U.S. PATENT DOCUMENTS

| | | | |
|---|---|---|---|
| 6,503,686 B1 * | 1/2003 | Fryd et al. | 430/907 |
| 6,517,990 B1 * | 2/2003 | Choi et al. | 430/910 |
| 6,610,456 B2 * | 8/2003 | Allen et al. | 430/907 |
| 2002/0061464 A1 * | 5/2002 | Aoai et al. | 430/914 |
| 2003/0203306 A1 * | 10/2003 | Choi et al. | 430/910 |
| 2003/0211417 A1 * | 11/2003 | Fryd et al. | 430/907 |

FOREIGN PATENT DOCUMENTS

WO       WO 00/67072       * 11/2000

* cited by examiner

Primary Examiner—Richard L. Schilling
(74) Attorney, Agent, or Firm—F. Chau & Associates, LLC

(57) ABSTRACT

A photosensitive polymer having a hydroxy alkyl vinyl ether monomer and a resist composition are provided. The photosensitive polymer includes an alkyl vinyl ether monomer having the formula, and the photosensitive polymer has a weight average molecular weight of 3,000 to 50,000:

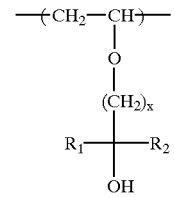

where x is an integer from 3 to 6 inclusive, $R_1$ and $R_2$ are independently alkyl having from 1 to 20 carbon atoms, fluorinated alkyl having from 1 to 10 carbon atoms or perfluoronated alkyl having from 1 to 10 carbon atoms.

44 Claims, No Drawings

PHOTOSENSITIVE POLYMER AND PHOTORESIST COMPOSITION THEREOF

BACKGROUND OF THE INVENTION

1. Field of the Invention

The present invention relates to a photosensitive polymer and a photoresist composition thereof.

2. Description of the Related Art

A smaller sized pattern design rule of not greater than 0.2 μm is necessary in a semiconductor memory device having a capacity exceeding 1 Gbit. A photolithographic technique has been proposed in which an argon fluoride excimer laser ("ArF") capable of forming 0.1 μm patterns and having a wavelength of 193 nm, which is even shorter than that of a conventional krypton fluoride excimer laser ("KrF") having a wavelength of 248 nm, and a $F_2$ excimer laser capable of forming 0.07 μm patterns and having a wavelength of 157 nm, are used as a new type of exposure light source. According to the change in exposure light source, there is an increasing demand for developing new photoresist materials having transparency at a shorter wavelength of 193 nm or less; high resistance to dry etching; good adhesion to layer materials above or below; easily capable of being developed using conventional aqueous developing solutions; and excellent in annealing effect during baking.

However, compared to the conventional KrF resist materials, known ArF or $F_2$ resist materials pose many problems for practical use. For example, poly(methyl methacrylate-t-butyl methacrylate-methacrylic acid), a terpolymer known in the art, is weak in resistance to dry etching.

In the case of a cycloolefin-maleic anhydride ("COMA") alternating polymer having the following formula, the production cost of raw material is cheap, whereas yield of the polymer sharply decreases. In addition, the transmittance of the polymer is very low at a short wavelength region, such as, for example, at 193 nm. The above COMA synthetic polymers have alicyclic hydrocarbon in their backbone, which shows prominent hydrophobicity, and thus the adhesiveness to neighboring material layers below is very poor.

[Formula 1]

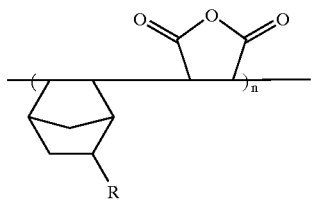

The copolymer has a glass transition temperature of 200° C. or more due to the structural characteristic of the backbone. As a result, it is difficult to achieve an annealing effect for eliminating a dynamic volume from the resist layer formed of the polymer with the above structure during baking. Accordingly, the resist layer has poor environmental resistance. As a result, when the polymer contacts a basic contaminant in the atmosphere, acid ("H+") generated from a photoacid generator ("PAG") by exposure cannot participate in acidolysis in the polymer and is quenched. Also, the acid is easily diffused into a non-exposed portion, thereby producing a photoresist pattern having a poor profile, such as, for example, a T-top profile. In addition, the resist layer is deformed due to e-beam while the photoresist pattern is observed by V-SEM, thus making it difficult to determine a good or bad state of the pattern. Also, these polymers do not have satisfactory transmittance.

SUMMARY OF THE INVENTION

The above and other drawbacks and disadvantages of the prior art are addressed by embodiments of the present disclosure that provide a photosensitive polymer which has a high enough glass transition temperature to acquire an annealing effect during baking while satisfying requirements as a main component of a resist material.

It is another advantage of the present invention to provide a photoresist composition containing the photosensitive polymer, suitable for an exposure light source having a shorter wavelength of 193 nm or less.

Accordingly, to achieve the above advantage, there is provided a photosensitive polymer including 10 to 90 mol % of an alkyl vinyl ether monomer having the formula, and 10 to 90 mol % of at least one monomer selected from the group consisting of an acrylate derivative, methacrylate derivative, fumarate derivative and 4-hydroxy styrene derivative, having an acid-labile hydrocarbon with from 4 to 20 carbon atoms, or at least one monomer selected from the group consisting of acrylonitrilie derivative and norbornene derivative, having an acid-labile substituent group with from 4 to 20 carbon atoms, and the photosensitive polymer has a weight average molecular weight of 3,000 to 50,000:

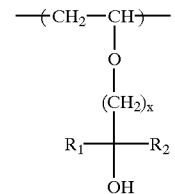

where x is an integer from 3 to 6 inclusive, $R_1$ and $R_2$ are independently alkyl having from 1 to 20 carbon atoms, fluorinated alkyl having from 1 to 10 carbon atoms or perfluoronated alkyl having from 1 to 10 carbon atoms.

In another aspect of the present invention, a photosensitive polymer includes 10 to 90 mol % of an alkyl vinyl ether monomer having the formula, and not greater than 50 mol % of a maleic acid anhydride monomer, wherein the photosensitive polymer has a weight average molecular weight of 3,000 to 50,000.

Preferably, the photosensitive polymer further includes at least one monomer selected from the group consisting of an acrylate derivative, methacrylate derivative, fumarate derivative and 4-hydroxy styrene derivative, having an acid-labile hydrocarbon with from 4 to 20 carbon atoms, or at least one monomer selected from the group consisting of acrylonitrilie derivative and norbornene derivative, having an acid-labile substituent group with from 4 to 20 carbon atoms.

According to another aspect of the present invention, there is provided a photoresist composition including at least one polymer selected from the above photosensitive polymers, and 1.0 to 15 wt % of a photoacid generator ("PAG") based on the weight of the photosensitive polymer.

Preferably, the PAG includes a triarylsulfonium salt, diaryliodonium salt, sulfonate or a mixture of these materials.

The resist composition may include 0.01 to 20 wt % by weight an organic base based on the weight of the photosensitive polymer.

DETAILED DESCRIPTION OF PREFERRED EMBODIMENTS

A photosensitive polymer and a photoresist composition thereof are provided and described. Also, a preferred photolithography process using the photoresist composition will be described. This invention may, however, be embodied in many different forms, and these embodiments are provided so that this disclosure will be thorough and complete, and will fully convey the scope of the invention to those skilled in the art. In formulas, the same characters denote the same functional groups.

A photosensitive polymer according to an exemplary embodiment of the present disclosure includes 10 to 90% by mole of a hydroxy alkyl vinyl ether monomer, and thus has vinyl ether as a main component of its backbone. The vinyl ether backbone is more flexible than a conventional alicyclic hydrocarbon backbone, contributing to lowering a glass transition temperature of the photosensitive polymer. The vinyl ether is preferably substituted by a $C_1$–$C_{20}$ hydroxy alkyl group to further increase the flexibility of the photosensitive polymer. More preferably, the vinyl ether is substituted by a $C_1$–$C_{10}$ hydroxy fluoroalkyl group or a $C_1$–$C_{10}$ hydroxy perfluoroalkyl group to increase transmittance with respect to an exposure light source of 157 nm. Since the substituent includes a hydroxy group (—OH), the adhesion and wettability of the photosensitive polymer against layer materials can be enhanced. The vinyl ether monomer can be expressed by the following formula 2:

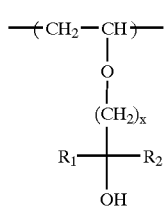

[Formula 2]

wherein x is an integer in the range of 3 to 6 inclusive, $R_1$ and $R_2$ are individually $C_1$ to $C_{20}$ alkyl, $C_1$ to $C_{10}$ fluoronated alkyl or $C_1$ to $C_{10}$ perfluoronated alkyl.

Since the hydroxy alkyl vinyl ether monomer has an electron-donating property, it is polymerized with one or more other monomers having an electron-withdrawing property to facilitate polymerization, thereby forming a photosensitive polymer. Usable monomers capable of being polymerized with the hydroxy alkyl vinyl ether monomer include monomers selected from the group consisting of an acrylate derivative, methacrylate derivative, fumarate derivative and 4-hydroxy styrene derivative, having an acid-labile hydrocarbon with from 4 to 20 carbon atoms, or monomers selected from the group consisting of acrylonitrilie derivative and norbornene derivative, having an acid-labile substituent group with from 4 to 20 carbon atoms. The electron-withdrawing monomer is included in the polymer in a ratio of 10 to 90% by mole.

For acrylate derivatives, methacrylate derivatives, fumarate derivatives or 4-hydroxy styrene derivatives, t-butyl, tetrahydropyranyl or 1-ethoxy ethyl is suitably used as the $C_4$ to $C_{20}$ acid-labile hydrocarbon group.

In the case where the acid-labile substituent group is a $C_6$ to $C_{20}$ alicyclic hydrocarbon group, the dry etching resistance of the photosensitive polymer is improved.

For acrylonitrile derivatives or norbornene derivatives, a $C_4$ to $C_{10}$ ester group is suitably used as the acid-labile substituent group.

The monomers can be polymerized by general radical polymerization, cationic polymerization or anionic polymerization. The polymerized photosensitive polymers have an appropriate weight average molecular weight of 3,000 to 50,000.

Examples of copolymers suitable for the photosensitive polymers according to exemplary embodiments of the present disclosure are represented by the following formulas 3 and 4, and examples of terpolymers suitable for the photosensitive polymers according to exemplary embodiments of the present disclosure are represented by the following formula 5:

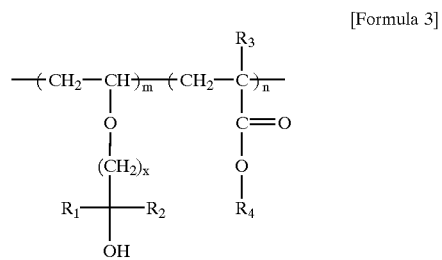

[Formula 3]

wherein m and n are both integers, the value of m/(m+n) differs according to the kind of alkyl vinyl ether monomer used, preferably in the range of 0.1 to 0.9 from the viewpoint of adjustment of overall characteristics;

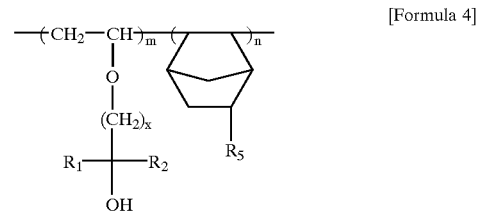

[Formula 4]

wherein m and n are both integers, and m/(m+n) equals 0.1 to 0.9; and

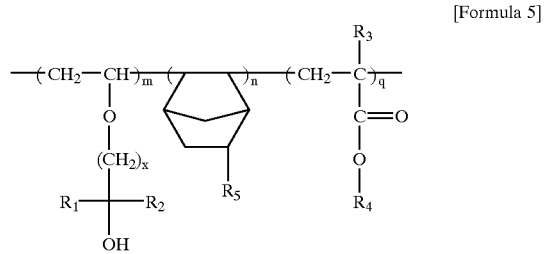

[Formula 5]

wherein m, p and q are all integers, and m/(m+n+q) equals 0.1 to 0.4, n/(m+n+q) equals 0.1 to 0.5, and q/(m+n+q) equals 0.1 to 0.5.

In formulas 3–5, wherein $R_3$ hydrogen or methyl; $R_4$ is $C_4$ to $C_{20}$ acid-labile hydrocarbon; and $R_5$ is $C_4$ to $C_{20}$ acid-labile substituent group. $R_4$ is preferably t-butyl, tetrahydropyranyl or 1-ethoxy ethyl, facilitating the photosensitive copolymer to function as a positive chemically amplified resist.

Also, $R_4$ may be $C_6$ to $C_{20}$ tertiary alicyclic hydrocarbon. Suitable tertiary alicyclic hydrocarbons include 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo [5.2.1.0$^{2,6}$]decanyl, 2-methyl-2-adamantyl, 2-ethyl-2-adamantyl, 2-propyl-2-adamantyl, 2-methyl-2-fenchyl and 2-ethyl-2-fenchyl. Use of the tertiary alicyclic hydrocarbons increases dry etching resistance of the photosensitive polymer.

In the copolymer represented by the formula 3, since a first monomer is hydroxy alkyl vinyl ether and a second monomer is an acrylate derivative or methacrylate derivative, the backbone of the polymer is very flexible. Thus, the glass transition temperature of the photosensitive polymer has an appropriate value in the range of approximately 130 to approximately 180° C.

In formula 4, $R_5$ is preferably an acid-labile ester for the photosensitive polymer to function as a positive chemically amplified resist.

The acid-labile ester is preferably t-butyl ester, tetrahydropyranyl ester or 1-ethoxyethyl ester.

In formulas 4 and 5, norbornene used in the backbone increases the dry etching resistance.

In another exemplary embodiment of the present disclosure, there is provided a photosensitive polymer including at least 10 to 90 mol % of a hydroxy alkyl vinyl ether monomer and not greater than 50 mol % of an maleic acid anhydride monomer. In this case, a copolymer having the formula 6, a terpolymer having the formula 7 or 8, or a tetrapolymer having the formula 9, is suitably used as the photosensitive polymer according to alternate embodiments of the present disclosure. $R_1$ through $R_5$ are as defined above.

[Formula 6]

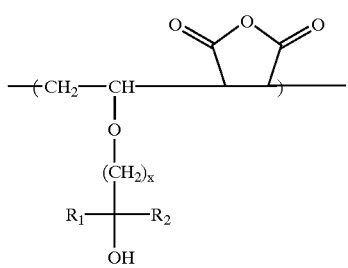

[Formula 7]

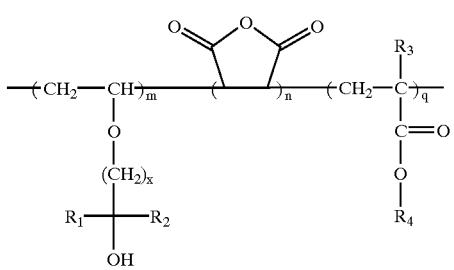

wherein m, n and q are all integers, and m/(m+n+q) equals 0.1 to 0.4, n/(m+n+q) equals 0.1. to 0.5, and q/(m+n+q) equals 0.1 to 0.5.

[Formula 8]

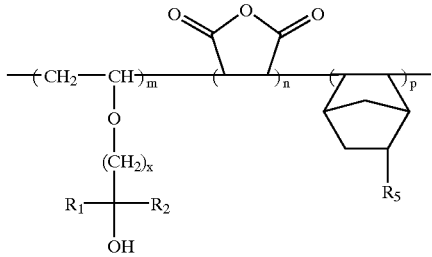

wherein m, n and p are all integers, and m/(m+n+p) equals 0.1 to 0.4, n/(m+n+p) equals 0.1 to 0.5, and q/(m+n+p) equals 0.1 to 0.5.

[Formula 9]

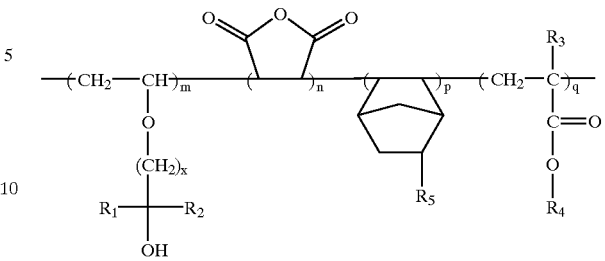

wherein m, n, p and q are all integers, and m/(m+n+p+q) equals 0.1 to 0.4, n/(m+n+p+q) equals 0.1 to 0.5, and p/(m+n+p+q) equals to 0.1 to 0.4 and q/(m+n+p+q) equals 0.1 to 0.5.

If a monomer of maleic acid anhydride is further included, a more perfect alternating copolymer can be obtained by general radical polymerization. Therefore, the yield of polymers can be increased.

To prepare a photoresist composition according to exemplary embodiments of the present disclosure, the polymers synthesized above are dissolved in various types of solvents such as propylene glycol monomethyl ether acetate ("PGMEA"), ethyl lactate or cyclohexanone with a photoacid generator ("PAG") to prepare a resist solution.

The PAG is preferably contained in an amount of 1 to 15% by weight based on the weight of the photosensitive polymer. Suitable PAGs include triarylsulfonium salts, diaryliodonium salts, sulfonate, N-hydroxysuccinimide triflate or mixtures thereof.

Examples of the PAG include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitro benzyl sulfonate, pyrogallol tris(alkyl-sulfonate), norbornenedicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboximide nonaflate, triphenylsulfonium perfluorooctanesulfonate, diphenyliodonium perfluorooctanesulfonate, methoxydiphenyliodonium perfluorooctane sulfonate, di-t-butyldiphenyliodonium triflate, N-hydroxysuccinimide perfluorooctanesulfonate, or norbornene dicarboximide perfluorooctanesulfonate.

Preferably, the photoresist composition of preferred embodiments of the present disclosure further includes 0.01 to 2% by weight of an organic base based on the weight of the photosensitive polymer. Suitable organic bases include tertiary amines. Usable examples of the organic base include triethylamine, triisobutylamine, triisooctylamine, diethanolamine, triethanolamine or a mixture thereof. The organic base is added for preventing a pattern deformation, which results from an unexpected acidolysis caused by the acid generated at the exposed regions and then diffused into the unexposed regions after exposure.

Also, a photoresist composition according to embodiments of the present disclosure includes 30 to 200 ppm of an organic or base surfactant, which functions to allow the photoresist composition to be uniformly coated on a substrate.

To adjust the overall dissolution speed of the resist, the resist composition of exemplary embodiments further includes 5 to 25% by weight of a dissolution inhibitor, based on the weight of the photosensitive polymer.

For a lithography process, the resist solution is first filtered twice using a 0.2 μm membrane filter to thus obtain a resist composition.

The obtained resist composition is subjected to the following process to obtain a pattern.

A bare silicon wafer or a silicon wafer having a layer to be patterned thereon is prepared and treated with hexamethyidisilazane ("HMDS"). Thereafter, the silicon wafer layer is coated with the resist composition to a thickness of approximately 0.2 to 0.7 μm to form a resist layer.

The silicon wafer having the resist layer is pre-baked at a temperature in the range of 90 to 180° C., preferably 110 to 140° C., for approximately 60 to 120 seconds to remove a solvent, followed by exposure using various exposure light sources, for example, a KrF, ArF or $F_2$ excimer laser. In the case of using a light source having a wavelength of 193 nm or less, exposure is performed at a dose of 5 to 100 $mJ/cm^2$. Next, post-exposure baking ("PEB") is performed at a temperature in the range of 90 to 180° C., preferably 110 to 140° C., for approximately 60 to 120 seconds to cause acidolysis at an exposed portion of a resist layer. As a result, acidolysis actively occurs at the exposed portion, allowing the exposed portion to exhibit very high solubility to a developing solution including 2.38 wt % tetramethylammonium hydroxide ("TMAH"). Thus, during development, the exposed portion is dissolved well for removal.

The silicon wafer or the layer to be patterned is etched by a special etching gas, such as plasma, e.g., a halogen or $C_xF_y$, gas, using the resultant resist pattern as a mask. Subsequently, the resist pattern remaining on the wafer is removed by ashing and a wet process using a stripper, thereby forming a desired pattern.

The resist composition according to embodiments of the present disclosure can solve both problems of transmittance and adhesion associated with conventional resist materials having a COMA polymer as a main component.

Since conventional COMA alternating polymers have a very high glass transition temperature of 200° C. or higher due to their rigid backbone, many problems may have been involved during process. On the other hand, the photosensitive polymer included in the resist composition according to exemplary embodiments has an appropriate glass transition temperature in the range of 130 to 180° C. Thus, the resist layer formed of the photosensitive polymer according to embodiments of the present disclosure has a sufficient annealing effect during baking, thereby reducing its dynamic volume. Accordingly, the environmental resistance of the resist layer improves, thereby enhancing lithography performance.

Illustrative exemplary embodiments of the present disclosure will be described in detail with reference to the following examples and synthesis examples, and what can be technically deduced by one skilled in the art is not described herein. It is noted that reagents used for explaining the invention are generally available, and most are available from Aldrich Chemical Co.

SYNTHESIS EXAMPLE 1

Synthesis of 3-hydroxy-3,3'-di(trifluoromethyl)propyl Vinyl Ether

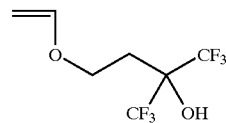

3.5 g (0.15 mol) of magnesium and dry tetrahydrofuran ("THF") were put in a round-bottom flask and a trace of dibromoethane was then added thereto to promote the reaction, followed by slowly adding dropwise 17 g (0.14 mol) of 3-chloropropyl vinyl ether and 150 mL of THF to then be reacted under a reflux condition for approximately 2 hours. Thereafter, while the reactant was maintained at a temperature of −78° C., 25 g (0.15 mol) of hexafluoroacetone was slowly added dropwise to the reactant, followed by reacting the reactant at room temperature for approximately 12 hours.

After the reaction was completed, the reactant was dropped into excess water, neutralized with a weak sulfuric acid solution, extracted with diethyl ether, and dried with sulfuric magnesium. Next, the solvent was evaporated using a rotary evaporator, and then a monomer having the above formula was separated using column chromatography (hexane:ethyl acetic acid=3:1) (yield: 85%).

SYNTHESIS EXAMPLE 2

Synthesis of Copolymer

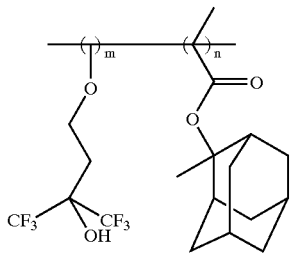

2.5 g (10 mol) of the monomer synthesized in Synthesis Example 1, 2.4 g (10 mmol) of 2-methyl-2-adamantyl methacrylate and 0.06 g (2 mol %) of t-butyl peroxide were dissolved in 10 g of chlorobenzene to then be put in an ample flask. Then, oxygen gas ("$O_2$") remaining in the solution was removed using liquid nitrogen and completely purged with nitrogen gas, followed by hermetically sealing. Thereafter, while the temperature of the reactant was maintained at 130° C., the reactant was polymerized for 20 hours.

After the polymerization was completed, the reactant was dropped into excess n-hexane (10-fold) for precipitation. The precipitate was filtered using a glass filter, dissolved again in an appropriate amount of THF and then reprecipitated in excess n-hexane, followed by drying at a vacuum oven maintained at about 50° C. for about 24 hours to acquire a copolymer having the above formula (yield: 70%).

The weight average molecular weight and polydispersity (Mw/Mn) of the obtained product were 8,900 and 2.2, respectively.

SYNTHESIS EXAMPLE 3

Synthesis of Copolymer

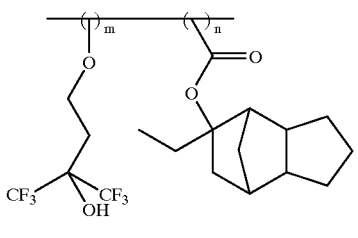

A copolymer having the above formula was acquired by carrying out polymerization in the same manner as described in Synthesis Example 2, except that 2.4 g (10 mol) of a 8-ethyl-8-tricyclodesyl acrylate monomer was used, instead of the 2-methyl-2-adamantyl methacrylate (yield: 70%).

The weight average molecular weight and polydispersity (Mw/Mn) of the obtained product were 8,300 and 2.1, respectively.

SYNTHESIS EXAMPLE 4

Synthesis of Terpolymer

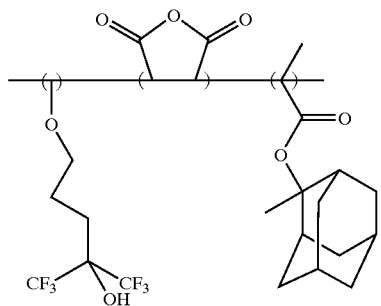

6 g (25 mmol) of the monomer synthesized in Synthesis Example 1, 2.5 g (25 mmol) of maleic acid anhydride, 5.9 g (25 mmol) of 2-methyl-2-adamantyl methacrylate and 0.37 g (3 mol %) of AIBN were dissolved in 30 g of THF in a round-bottom flask and completely purged with nitrogen gas, followed by polymerizing at a temperature of approximately 65° C. for approximately 20 hours.

After the polymerization was completed, the reactant was slowly precipitated in a solution of excess n-hexane and isopropyl alcohol mixed in a ratio of 7:3, and then the precipitate was filtered. Subsequently, the precipitate was dissolved in an appropriate amount of THF and reprecipitated in n-hexane, and dried at a vacuum oven maintained at a temperature of approximately 50° C. for approximately 24 hours, thereby the terpolymer having the above formula (yield: 75%).

The weight average molecular weight and polydispersity (Mw/Mn) of the obtained product were 9,700 and 2.0, respectively.

SYNTHESIS EXAMPLE 5

Synthesis of Terpolymer

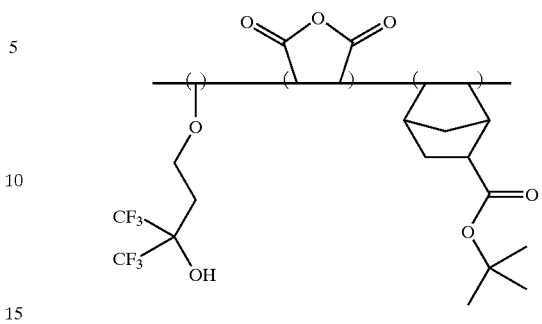

A terpolymer having the above formula was acquired by carrying out polymerization in the same manner as described in Synthesis Example 4, using 4.8 g (20 mol) of the monomer synthesized in Synthesis Example 1 and 5.8 g (30 mmol) of t-butyl-5-norbornene-carboxylic ester monomer (yield: 72%).

The weight average molecular weight and polydispersity (Mw/Mn) of the obtained product were 8,500 and 2.1, respectively.

Preparation of Resist Composition and Photolithography Process Using the Same 1.0 g of each of the polymers synthesized in Synthesis Examples 2–5 and 0.01 g of triphenylsulfornium triflate as a photoacid generator ("PAG") were dissolved in 8.0 g of a PGMEA solvent, and 2 mg of triisobutylamine as an organic base was added thereto for complete dissolution, followed by filtering using a 0.2 μm membrane filter, yielding a resist composition. A silicon ("Si") wafer treated with HMDS at approximately 3000 rpm was coated with the obtained resist composition to a thickness of approximately 0.33 μm.

Thereafter, the coated wafer was soft-baked at a temperature of 130° C. for 90 seconds, is exposed using an ArF excimer laser stepper (manufactured by ISI Co., NA=0.6, σ=0.75), followed by performing post-exposure baking ("PEB") at 120° C. for 90 seconds.

Next, development is performed using 2.38% by weight of tetramethylammonium hydroxide ("TMAH") to form a resist pattern, and the results thereof are listed in Table 1.

TABLE 1

| Polymer | Line and space pattern |
| --- | --- |
| Polymer of Synthesis Example 2 | ⊚ |
| Polymer of Synthesis Example 3 | ⊚ |
| Polymer of Synthesis Example 4 | ⊚ |
| Polymer of Synthesis Example 5 | ⊚ |

(⊚ represents that V-SEM observation result of 180 nm line-and-space pattern obtained at an exposure dose of approximately 11 to 18 mJ/cm² is clean and good.)

Since a photosensitive polymer according to this embodiment of the present disclosure includes a hydroxy alkyl vinyl ether monomer, it is more flexible than a conventional photosensitive polymer having an alicyclic hydrocarbon backbone. Thus, the glass transition temperature of this exemplary photosensitive polymer according to the present disclosure falls under the baking temperature range of resist materials. The photoresist layer formed of a resist material having the photosensitive composition according to the present disclosure as a main component, has a sufficient annealing effect during baking, thereby reducing the dynamic volume in the resist layer. Thus, environmental resistance is enhanced even at post-exposure delay ("PED") and V-SEM observation of a pattern shows no resist layer deformation due to e-beam, thereby easily determining the pattern state. Therefore, this photosensitive polymer according to the present disclosure exhibits excellent lithography performance so that it can be advantageously used for manufacture of next generation semiconductor devices.

Also, a photosensitive polymer according to the present disclosure having a hydroxy alkyl bonded to a vinyl ether monomer has good adhesion to underlying layer materials and wettability, and in the case where fluoride is substituted to the alkyl group, it exhibits high transmittance with respect to an exposure light source having a wavelength of 157 nm.

In addition, the glass transition temperature of the photosensitive polymer according to embodiments of the present disclosure can be further lowered according to different kinds of monomers bonded to the vinyl ether monomer, and dry etching resistance and contrast characteristics thereof can be improved. Other advantages of the photosensitive polymer according to the present disclosure are that monomers used for the manufacture of polymers are cheap and can be acquired with high yield.

While the invention has been described with reference to exemplary embodiments, it will be understood by those of ordinary skill in the pertinent art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope and spirit of the appended claims.

What is claimed is:

1. A photosensitive polymer comprising:
   about 10 to about 90 mol % of an alkyl vinyl ether monomer having the formula; and
   about 10 to about 90 mol % of at least one monomer selected from the group consisting of an acrylate derivative, a methacrylate derivative, a fumarate derivative and a 4-hydroxy styrene derivative, each having an acid-labile hydrocarbon having from about 4 to about 20 carbon atoms, or selected from the group consisting of an acrylonitrilie derivative and a norbornene derivative, each having an acid-labile substituent group having from about 4 to about 20 carbon atoms, and the photosensitive polymer has a weight average molecular weight of about 3,000 to about 50,000:

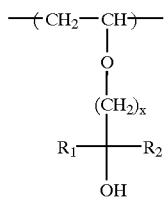

where x is an integer from 3 to 6 inclusive, $R_1$ and $R_2$ are independently at least one of alkyl having from 1 to about 20 carbon atoms, fluorinated alkyl having from 1 to about 10 carbon atoms, and perfluoronated alkyl having from 1 to about 10 carbon atoms.

2. The photosensitive polymer of claim 1, wherein $R_1$ and $R_2$ are independently trifluoromethyl.

3. The photosensitive polymer of claim 1, wherein the polymer comprises a copolymer having the formula:

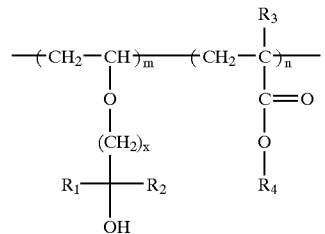

where $R_3$ is selected from the group consisting of a hydrogen atom and methyl, $R_4$ comprises an acid-labile hydrocarbon group having from about 4 to about 20 carbon atoms, m and n are both integers, and m/(m+n) is in the range of about 0.1 to about 0.9.

4. The photosensitive polymer of claim 3, wherein $R_4$ is selected from the group consisting of t-butyl, tetrahydropyranyl, and 1-ethoxy ethyl.

5. The photosensitive polymer of claim 3, wherein $R_4$ comprises a tertiary alicyclic hydrocarbon having from about 6 to about 20 carbon atoms.

6. The photosensitive polymer of claim 5, wherein the tertiary alicyclic hydrocarbon is selected from the group consisting of 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl, and 2-ethyl-2-fenchyl.

7. The photosensitive polymer of claim 1, wherein the polymer comprises a copolymer having the formula:

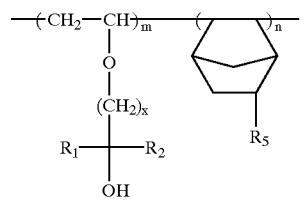

where $R_5$ comprises an acid-labile substituent group having from about 4 to about 10 carbon atoms, m and n are both integers, and m/(m+n) is in the range of about 0.1 to about 0.9.

8. The photosensitive polymer of claim 7, wherein $R_5$ comprises an acid-labile ester.

9. The photosensitive polymer of claim 8, wherein the acid-labile ester group is selected from the group consisting of t-butyl ester, tetrahydropyranyl ester, and 1-ethoxy ethyl ester.

10. The photosensitive polymer of claim 1, wherein the polymer comprises a terpolymer having the formula:

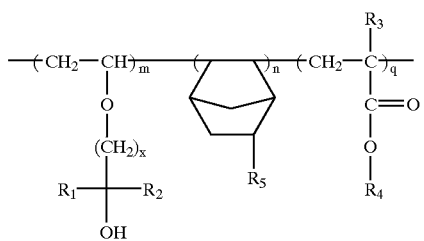

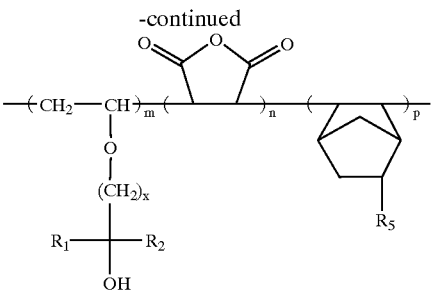

where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, p and q are all integers, and m/(m+n+q) is in the range of about 0.1 to about 0.4, n/(m+n+q) is in the range of about 0.1 to about 0.5 and q/(m+n+q) is in the range of about 0.1 to about 0.5.

11. A photosensitive polymer comprising:

about 10 to about 90 mol % of an alkyl vinyl ether monomer having the formula; and not greater than about 50 mol % of a maleic acid anhydride monomer, wherein the photosensitive polymer has a weight average molecular weight of about 3,000 to about 50,000:

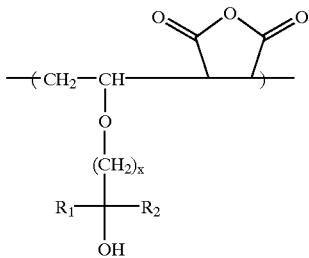

where x is an integer from 3 to 6 inclusive, $R_1$ and $R_2$ are independently at least one of alkyl having from 1 to about 20 carbon atoms, fluorinated alkyl having from 1 to about 10 carbon atoms, and perfluoronated alkyl having from 1 to about 10 carbon atoms.

12. The photosensitive polymer of claim 11, wherein $R_1$ and $R_2$ are independently trifluoromethyl.

13. The photosensitive polymer of claim 11, wherein the polymer comprises a terpolymer having one of the formulae:

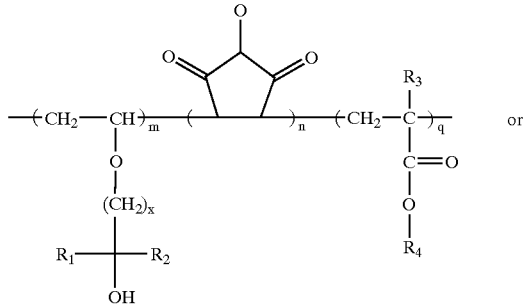

or where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, n, p and q are all integers, m/(m+n+q) is in the range of about 0.1 to about 0.4, n/(m+n+q) is in the range of about 0.1 to about 0.5, q/(m+n+q) is in the range of about 0.1 to about 0.5, m/(m+n+p) is in the range of about 0.1 to about 0.4, n/(m+n+p) is in the range of about 0.1 to about 0.5, and p/(m+n+p) is in the range of about 0.1 to about 0.5.

14. The photosensitive polymer of claim 13, wherein $R_4$ is selected from the group consisting of t-butyl, tetrahydropyranyl, and 1-ethoxy ethyl.

15. The photosensitive polymer of claim 13, wherein $R_4$ comprises a tertiary alicyclic hydrocarbon having from about 6 to about 20 carbon atoms.

16. The photosensitive polymer of claim 15, wherein the tertiary alicyclic hydrocarbon is selected from the group consisting of 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$] decanyl, 2-methyl-2-adamantyl, 2-ethyl-2-adamantyl, 2-propyl-2-adamantyl, 2-methyl-2-fenchyl, and 2-ethyl-2-fenchyl.

17. The photosensitive polymer of claim 13, wherein $R_5$ comprises an acid-labile ester.

18. The photosensitive polymer of claim 17, wherein the acid-labile ester group is selected from the group consisting of t-butyl ester, tetrahydropyranyl ester, and 1-ethoxy ethyl ester.

19. The photosensitive polymer of claim 11, wherein the polymer comprises a tetrapolymer having the formula:

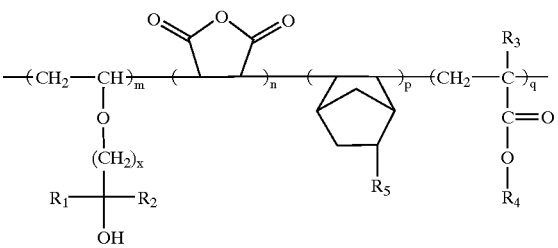

where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, n, p and q are all integers, m/(m+n+p+q) is in the range of about 0.1 to about 0.4, n/(m+n+p+q) is in the range of about 0.1 to about 0.5, p/(m+n+p+q) is in the range of about 0.1 to about 0.4, and q/(m+n+p+q) is in the range of about 0.1 to about 0.5.

20. A photoresist composition comprising:

a photosensitive polymer having from about 10 to about 90 mol % of an alkyl vinyl ether monomer having the formula, and from about 10 to about 90 mol % of at least one monomer selected from the group consisting of an acrylate derivative, a methacrylate derivative, a fumarate derivative and a 4-hydroxy styrene derivative, each having an acid-labile hydrocarbon having from about 4 to about 20 carbon atoms, or selected from the group consisting of an acrylonitrilie derivative and a norbornene derivative, each having an acid-labile substituent group having from about 4 to about 20 carbon atoms, and the photosensitive polymer has a weight average molecular weight of about 3,000 to about 50,000; and about 1.0 to about 15 wt % of a photoacid generator ("PAG") based on the weight of the photosensitive polymer:

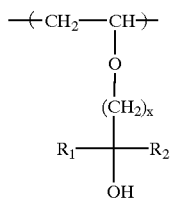

where x is an integer from 3 to 6 inclusive, $R_1$ and $R_2$ are independently at least one of alkyl having from 1 to about 20 carbon atoms, fluoronated alkyl having from 1 to about 10 carbon atoms, and perfluoronated alkyl having from 1 to about 10 carbon atoms.

21. The photoresist composition of claim 20, wherein $R_1$ and $R_2$ are independently trifluoromethyl.

22. The photoresist composition of claim 20, wherein the polymer comprises a copolymer having the formula:

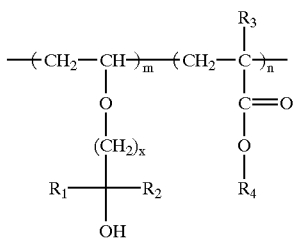

where $R_3$ is selected from the group consisting of a hydrogen atom and methyl, $R_4$ comprises an acid-labile hydrocarbon group having from about 4 to about 20 carbon atoms, m and n are both integers, and m/(m+n) is in the range of about 0.1 to about 0.9.

23. The photoresist composition of claim 22, wherein $R_4$ is selected from the group consisting of t-butyl, tetrahydropyranyl, and 1-ethoxy ethyl.

24. The photoresist composition of claim 22, wherein $R_4$ comprises a tertiary alicyclic hydrocarbon having from about 6 to about 20 carbon atoms.

25. The photoresist composition of claim 24, wherein the tertiary alicyclic hydrocarbon is selected from the group consisting of 2-methyl-2-norbornyl, 2-ethyl-2-norbornyl, 2-methyl-2-isobornyl, 2-ethyl-2-isobornyl, 8-methyl-8-tricyclo[$5.2.1.0^{2,6}$]decanyl, 8-ethyl-8-tricyclo[$5.2.1.0^{2,6}$]decanyl, 2-methyl-2-adamantyl, 2-ethyl-2-adamantyl, 2-propyl-2-adamantyl, 2-methyl-2-fenchyl, and 2-ethyl-2-fenchyl.

26. The photoresist composition of claim 20, wherein the polymer comprises a copolymer having the formula:

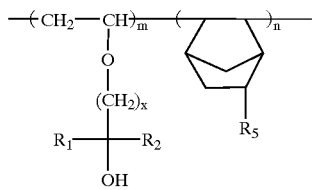

where $R_5$ comprises an acid-labile substituent group having from about 4 to about 10 carbon atoms, m and n are both integers, and m/(m+n) is in the range of about 0.1 to about 0.9.

27. The photoresist composition of claim 26, wherein $R_5$ comprises an acid-labile ester.

28. The photoresist composition of claim 27, wherein the acid-labile ester group is selected from the group consisting of t-butyl ester, tetrahydropyranyl ester, and 1-ethoxy ethyl ester.

29. The photoresist composition of claim 20, wherein the polymer comprises a terpolymer having the formula:

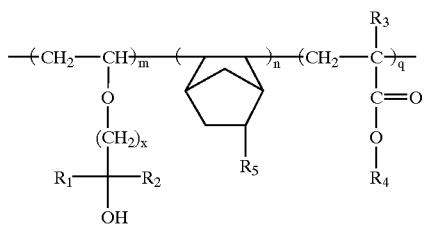

where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, p and q are all integers, and m/(m+n+q) is in the range of about 0.1 to about 0.4, n/(m+n+q) is in the range of about 0.1 to about 0.5 and q/(m+n+q) is in the range of about 0.1 to about 0.5.

30. The resist composition of claim 20, wherein the photoacid generator ("PAG") comprises at least one of triarylsulfonium salt, diaryliodonium salt, and sulfonate.

31. The resist composition of claim 20, further comprising about 0.01 to about 2 wt % by weight an organic base based on the weight of the photosensitive polymer.

32. The resist composition of claim 31, wherein the organic base comprises at least one of triethylamine, triisobutylamine, triisooctylamine, diethanolamine, and triethanolamine.

33. A resist composition comprising:

a photosensitive polymer having about 10 to about 90 mol % of an alkyl vinyl ether monomer having the formula and not greater than about 50 mol % of a maleic acid anhydride monomer and having a weight average molecular weight of about 3,000 to about 50,000; and about 1.0 to about 15 wt % of a PAG based on the weight of the photosensitive polymer:

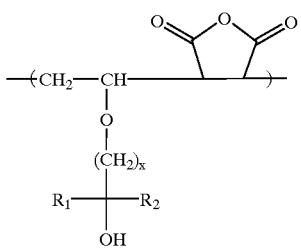

where x is an integer from 3 to 6 inclusive, $R_1$ and $R_2$ are independently at least one of alkyl having from 1 to about 20 carbon atoms, fluoronated alkyl having from 1 to about 10 carbon atoms, and perfluoronated alkyl having from 1 to about 10 carbon atoms.

34. The resist composition of claim 33, wherein $R_1$ and $R_2$ independently comprise trifluoromethyl.

35. The resist composition of claim 33, wherein the polymer comprises a terpolymer having one of the formulae:

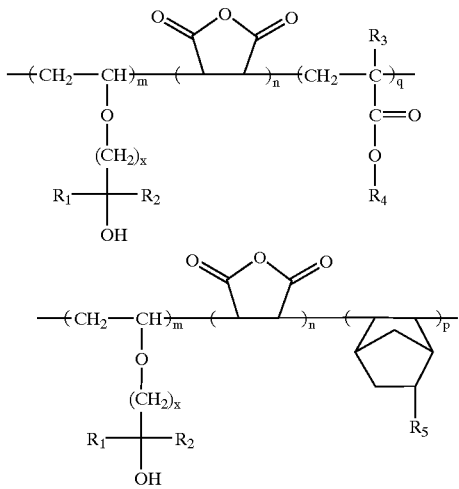

where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, n, p and q are all integers, m/(m+n+q) is in the range of about 0.1 to about 0.4, n/(m+n+q) is in the range of about 0.1 to about 0.5, q/(m+n+q) is in the range of about 0.1 to about 0.5, m/(m+n+p) is in the range of about 0.1 to about 0.4, n/(m+n+p) is in the range of about 0.1 to about 0.5, and p/(m+n+p) is in the range of about 0.1 to about 0.5.

36. The resist composition of claim 35, wherein $R_4$ is selected from the group consisting of t-butyl, tetrahydropyranyl, and 1-ethoxy ethyl.

37. The resist composition of claim 35, wherein $R_4$ comprises a tertiary alicyclic hydrocarbon having from about 6 to about 20 carbon atoms.

38. The resist composition of claim 37, wherein the tertiary alicyclic hydrocarbon is selected from the group consisting of 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl, and 2-ethyl-2-fenchyl.

39. The resist composition of claim 35, wherein $R_5$ comprises an acid-labile ester.

40. The resist composition of claim 39, wherein the acid-labile ester group is selected from the group consisting of t-butyl ester, tetrahydropyranyl ester, and 1-ethoxy ethyl ester.

41. The resist composition of claim 33, wherein the polymer comprises a tetrapolymer having the formula:

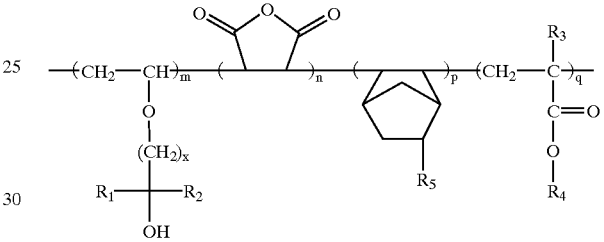

where $R_3$ is selected from the group consisting of a hydrogen atom and methyl, $R_4$ comprises an acid-labile hydrocarbon group having from about 4 to about 20 carbon atoms, $R_5$ comprises an acid-labile substituent group having from about 4 to about 10 carbon atoms, m, n, p and q are all integers, m/(m+n+p+q) is in the range of about 0.1 to about 0.4, n/(m+n+p+q) is in the range of about 0.1 to about 0.5, p/(m+n+p+q) is in the range of about 0.1 to about 0.4, and q/(m+n+p+q) is in the range of about 0.1 to about 0.5.

42. The resist composition of claim 33, wherein the photoacid generator ("PAG") comprises at least one of triarylsulfonium salt, diaryliodonium salt, and sulfonate.

43. The resist composition of claim 33, further comprising about 0.01 to about 2 wt % by weight an organic base based on the weight of the photosensitive polymer.

44. The resist composition of claim 43, wherein the organic base comprises at least one of triethylamine, triisobutylamine, triisooctylamine, diethanolamine, and triethanolamine.

* * * * *